US012653048B2

(12) United States Patent     (10) Patent No.:   US 12,653,048 B2

Sun et al.     (45) Date of Patent:    Jun. 9, 2026

(54) DOUBLE SIDE MOLDED LAND GRID ARRAY PACKAGE PLATFORM USING A SUBSTRATE WITH COPPER POSTS

(71) Applicant: Avago Technologies International Sales Pte. Limited, Singapore (SG)

(72) Inventors: Li Sun, San Jose, CA (US); Chang Kyu Choi, Fremont, CA (US); Sarah Haney, San Jose, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 667 days.

(21) Appl. No.: 17/989,559

(22) Filed: Nov. 17, 2022

(65) Prior Publication Data

US 2024/0170384 A1     May 23, 2024

(51) Int. Cl.
| | |
|---|---|
| *H10W 70/65* | (2026.01) |
| *H10W 42/20* | (2026.01) |
| *H10W 70/66* | (2026.01) |
| *H10W 74/10* | (2026.01) |
| *H10W 90/00* | (2026.01) |

(52) U.S. Cl.
CPC ........... *H10W 70/65* (2026.01); *H10W 42/20* (2026.01); *H10W 70/66* (2026.01); *H10W 74/114* (2026.01); *H10W 90/701* (2026.01)

(58) Field of Classification Search
CPC ........... H01L 23/3121; H01L 23/49811; H01L 23/49838; H01L 23/66; H01L 23/552; H01L 23/49866; H01L 24/14; H01L 2224/1405
USPC ....................................................... 257/659
See application file for complete search history.

(56) References Cited

U.S. PATENT DOCUMENTS

| | | | | |
|---|---|---|---|---|
| 6,316,735 B1 * | 11/2001 | Higashiguchi | ......... | H01R 12/52 |
| | | | | 257/781 |
| 9,142,533 B2 | 9/2015 | Shen et al. | | |
| 2005/0139981 A1 * | 6/2005 | Kobayashi | .......... | H01L 23/5227 |
| | | | | 257/E23.021 |
| 2007/0145539 A1 * | 6/2007 | Lam | ...................... | H01L 23/552 |
| | | | | 257/E23.125 |
| 2011/0048774 A1 * | 3/2011 | Sato | ........................ | H05K 3/244 |
| | | | | 174/257 |
| 2013/0270699 A1 | 10/2013 | Kuo et al. | | |
| 2015/0092356 A1 | 4/2015 | Yoshikawa et al. | | |

(Continued)

OTHER PUBLICATIONS

DE Examination Report on Appln. No. DE102023131508.0 dated Dec. 4, 2025.

*Primary Examiner* — Didarul A Mazumder

(74) *Attorney, Agent, or Firm* — Foley & Lardner LLP

(57) ABSTRACT

DSM-LGA using substrates with different surface finish options include copper posts for electrical communication. The copper posts include a height-to-width ratio that cannot be achieved in traditional copper posts, as well as a taper ratio that forms a more rectangular cross section as opposed to traditional copper posts. Additionally, by using copper, the copper posts include a relatively high thermal conductivity (as compared to solder), thus allowing the copper posts to dissipate thermal energy generated by integrated circuits and other processors. Copper posts can take the form of a single, cylindrical post. Alternatively, copper posts can be merged to form a variety of copper structures used for various applications, including I/O, grounding/isolation, and substrate support.

19 Claims, 8 Drawing Sheets

(56)          References Cited

U.S. PATENT DOCUMENTS

| | | | |
|---|---|---|---|
| 2018/0005918 A1* | 1/2018 | Naba | H05K 1/0265 |
| 2018/0350762 A1 | 12/2018 | Gu et al. | |
| 2019/0006306 A1* | 1/2019 | Shibata | H01L 24/14 |
| 2020/0035631 A1* | 1/2020 | Chang | H01L 24/06 |
| 2020/0091128 A1 | 3/2020 | Elsherbini et al. | |
| 2020/0154578 A1* | 5/2020 | Yang | H05K 3/40 |
| 2021/0313287 A1 | 10/2021 | Lin et al. | |
| 2022/0319968 A1* | 10/2022 | Chen | H01L 21/4853 |
| 2023/0245997 A1* | 8/2023 | Nakamura | H01L 25/0657 |
| | | | 257/737 |

* cited by examiner

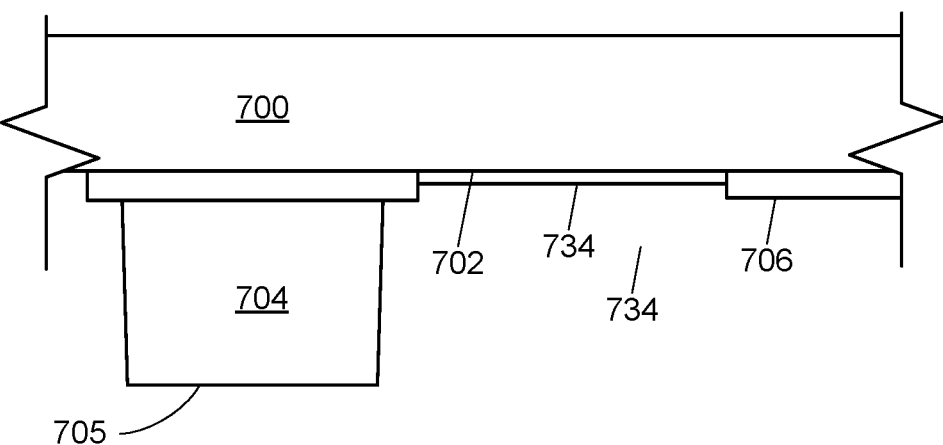
700
702  734  706
704
705
FIG. 7
800
804
836
FIG. 8
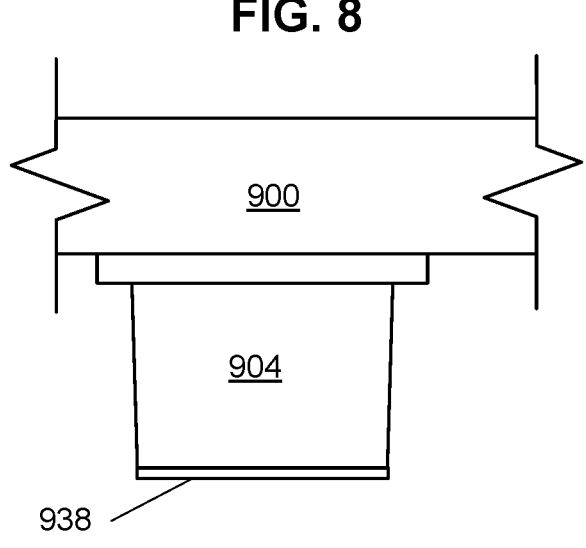
900
904
938
FIG. 9

DOUBLE SIDE MOLDED LAND GRID ARRAY PACKAGE PLATFORM USING A SUBSTRATE WITH COPPER POSTS

TECHNICAL FIELD

This application is directed to substrates, and more particularly, to double side molded (DSM) land grid array (LGA) with copper posts that include increased height-to-width ratios.

BACKGROUND

Traditional surface-mount substrates includes solder balls for electrical connections. Solder balls are generally spherical in shape. Certain constraints, such as a minimum dimension of the solder ball and minimum distance between adjacent/consecutive solder balls, are generally required due to the thermal conductivity of the solder.

BRIEF DESCRIPTION OF THE DRAWINGS

Certain features of the subject technology are set forth in the appended claims. However, for purpose of explanation, several embodiments of the subject technology are set forth in the following figures.

FIG. 7 illustrates a side view of a substrate with a material plated to a bottom surface of the substrate, in accordance with aspects of the present disclosure.

FIG. 8 illustrates a side view of a substrate with a copper post, showing solder disposed on to a top surface of the copper post, in accordance with aspects of the present disclosure.

FIG. 9 illustrates a side view of a substrate with a copper post, showing a material disposed on to a top surface of the copper post, in accordance with aspects of the present disclosure.

DETAILED DESCRIPTION

Figures 1A, 1B:
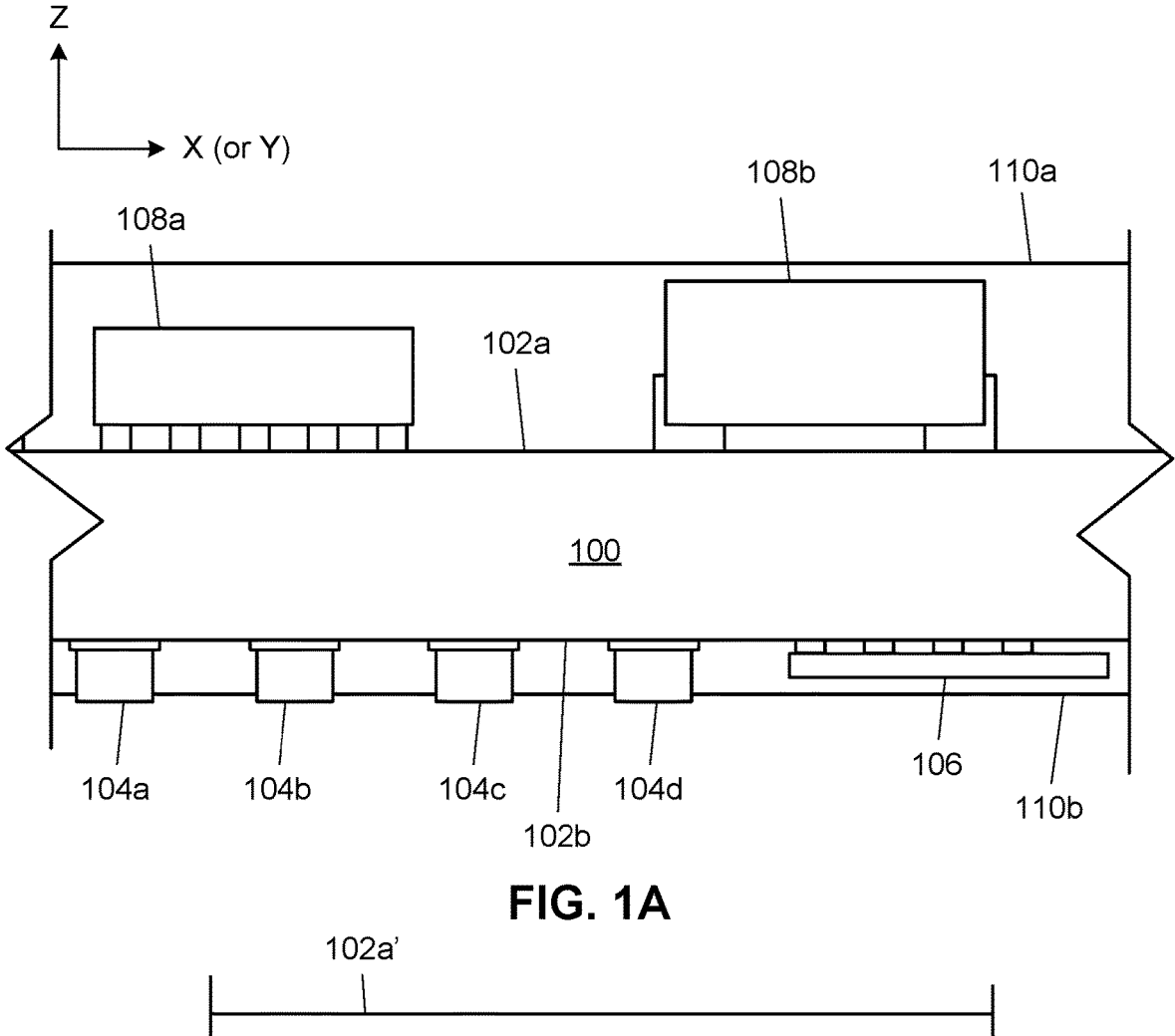
FIG. 1A illustrates a side view of a DSM-LGA package using a substrate, in accordance with aspects of the present disclosure.
FIG. 1B illustrates a side view of an alternate DSM-LGA package using a substrate, in accordance with aspects of the present disclosure.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced without these specific details. In some instances, well-known structures and components are shown in block diagram form in order to avoid obscuring the concepts of the subject technology.

The subject technology is directed to modifications to posts used for communication (e.g., input-output, or I/O) on substrates As described herein, in some embodiments, a substrate takes the form of a printed circuit board. Alternatively, in some embodiments, a substrate takes the form of a surface-mount substrate. As a non-limiting example, a surface-mount substrate may include a land grid array. Posts described herein may include copper posts formed from copper, including pure copper. Also, posts described herein may include several dimensional characteristics that offer various benefits. For example, a substrate may include several copper posts disposed thereon, with each copper post having a shorter height as compared to solder balls used on traditional substrates. Moreover, a pitch between adjacent copper posts may be shorter than that of solder balls on traditional substrates. Beneficially, substrates described herein may include a shorter form factor (due to the shorter copper post height) with a higher copper post density (due to the shorter copper post pitch). Also, due to the relatively higher thermal conductivity of copper as compared to solder, the copper posts provide better thermal energy dissipation, thus minimizing issues related to high thermal energy applications.

In order to control the dimensions of copper posts, a batch plating operation may be used. By using batch plating, the cross-sectional area of a copper posts can be controlled and formed in a more desired manner. Accordingly, copper posts described herein may be relatively rectangular as compared to traditional processes that use vertical continuous plating (VCP), which involves adding multiple consecutive layers of material to form the posts. VCP generally results in a more tapered, or trapezoid-shaped, post, leading to a greater/longer pitch and resultant lower post density. Also, by using batch plating, the height of a copper post described herein may be greater than that of traditional copper posts, while maintaining the desired cross-sectional shape.

While some copper posts described herein may include a cylindrical body, other shapes are possible. For example, in some embodiments, multiple copper posts are merged together to form copper structures with alternate shapes, including but not limited to a bar, an L-shaped structure, a cross, and a square. The resultant shape from merged multiple copper posts together provide advantages such as isolation between signal pins. Additionally, a structure having merged copper post may be placed at a corner of a substrate, thus offering structural support for the substrate against cracking.

These and other embodiments are discussed below with reference to FIGS. 1-9. However, those skilled in the art will readily appreciate that the detailed description given herein with respect to these Figures is for explanatory purposes only and should not be construed as limiting.

According to some embodiments, for example as shown in FIG. 1A, a substrate 100 includes a DSM-LGA with a surface 102a and a surface 102b (e.g., top surface and bottom surface, respectively). As shown, a component 108a and a component 108b are positioned on the surface 102a. The components 108a and 108b may include one of an integrated circuit such as a system on a chip (SOC), a combined wireless local area network (WLAN) and BLU- ETOOTH® circuit, an application-specific integrated circuit (ASIC), a 4th Generation (4G) circuit, or a 5G circuit, as non-limiting examples. Additionally, a copper post 104a, a copper post 104b, a copper post 104c, and a copper post 104d are located on the surface 102b. The copper posts 104a, 104b, 104c, and 104d can couple (e.g., electrically couple, as discussed above) to a circuit board (not shown in FIG. 1), including at least one type of circuit board referenced herein. In this regard, the copper posts 104a, 104b, 104c, and 104d can serve as I/O between the components 108a and 108b on the surface 102a and the circuits and components located on the circuit board.

Additionally, a die 106 is positioned on the surface 102b of the substrate 100. The components 108a and 108b is covered by a coating 110a, while the die 106 is covered by a coating 110b. The coatings 110a and 110b may be used for electromagnetic compatibility (EMC). Accordingly, the coatings 110 and 110b may each be referred to as an EMC coating. As shown in FIG. 1, the copper posts 104a, 104b, 104c, and 104d can at least partially extend beyond the coating 110a such that the copper posts 104a, 104b, 104c, and 104d are not fully covered by the coating 110b, thus allowing the copper posts 104a, 104b, 104c, and 104d to electrically connect to a circuit board. However, the components 108a and 108b are covered by the coating 110a. Due to the material makeup of the copper posts 104a, 104b, 104c, and 104d, the respective height (i.e., dimension along the Z-axis of a Cartesian coordinate system) of the copper posts 104a, 104b, 104c, and 104d can be reduced as compared to the height of solder balls used on traditional substrates, as copper provides a higher thermal conductivity than that of solder. For example, the copper posts 104a, 104b, 104c, and 104d may extend only 5 micrometers (μm) beyond the coating 110b, whereas solder balls may be required to extend as much as 50 μm beyond a similar coating. Beneficially, the overall height of an assembly of the substrate 100, including components mounted to the surfaces 102a and 102b, can be reduced, thus providing a smaller or thinner package.

Figure 2:
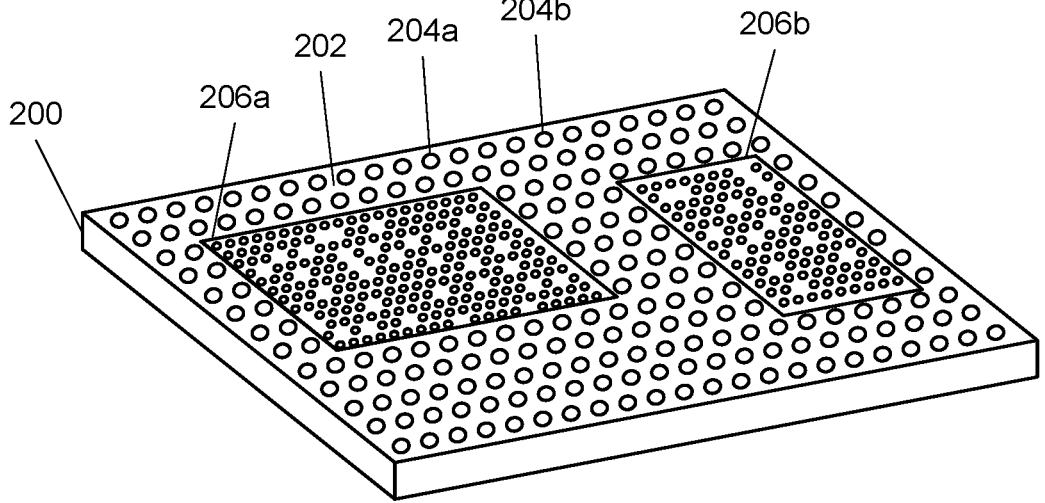
FIG. 2 illustrates a perspective view of an example substrate, in accordance with aspects of the present disclosure.

Referring to FIG. 2, a substrate 200 may include a land grid array (LGA) used to interface with integrated circuits (ICs), such as microprocessors, microcontrollers, etc. In some embodiments, the substrate 200 includes a double side molding (DSM) LGA, thus allowing for top and bottom assembly of components (e.g., ICs). In this manner, the substrate 200 may be suitable for radio frequency front-end (RFEE) modules. The substrate 200 may be used in 5G New Radio (NR) applications, such as mobile wireless communication devices (smartphones), Internet of Things (IoT), and vehicles (including autonomous vehicles), as non-limiting examples.

The substrate 200 includes a surface 202 on which several posts are located. For example, a post 104a and a post 204b (representative of additional posts) are mounted to the surface 202. The posts 204a and 204b may include copper posts, posts formed from pure copper. The posts 204a and 204b are designed to couple to a circuit board (e.g., printed circuit board, motherboard, main logic board (MLB), etc.). In this regard, the coupling between the posts 204a and 204b may provide an electrical coupling, resulting in I/O connections with the circuit board. In this manner, the substrate 200, and integrated circuits mounted onto the substrate 200, are designed to interface and communicate with the circuit board. The surface 202 may be used as a bottom surface that is opposite a top surface (not shown in FIG. 2), thus forming a DSM-LGA. Additionally, the substrate 200 may include multiple die, such as a die 206a and a die 206b formed on the surface 202 of the substrate 200.

Figure 3:
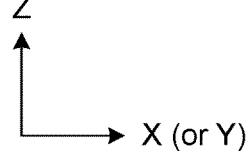
FIG. 3 illustrates a side view of a double-sided substrate, showing dimensional characteristics of copper posts, in accordance with aspects of the present disclosure.
Figure 3:
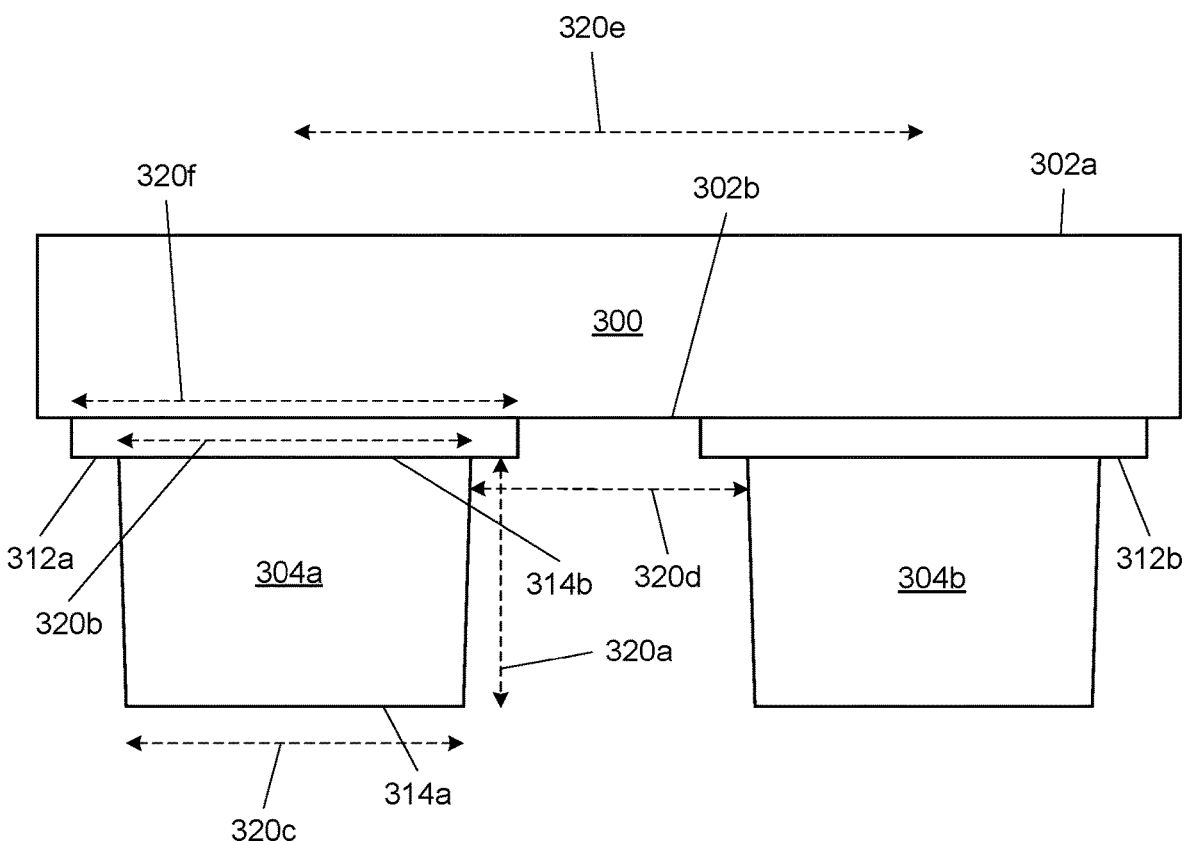

Referring to FIG. 3, a substrate 300 (e.g., DSM-LGA) includes a surface 302a and a surface 302b, with a copper post 304a and a copper post 304b located on the surface 302b. Also, the copper post 304a and the copper post 304b are mounted to a pad 312a and a pad 312b, respectively, with the pads 312a and 312b being mounted to the surface 302b. As shown, the copper post 304a includes a top surface 314a and a bottom surface 314b, with the bottom surface 314b mounted to a surface of the pad 312a.

Several dimensional characteristics for the copper post 304a are shown. For example, the copper post 304a includes a dimension 320a, which may be referred to as the height (along the Z-axis) of the copper post 304a. The dimension 320a extends from the bottom surface 314b to the top surface 314a of the copper post 304a. The dimension 320a may be approximately in the range of 30 to 320 μm. For example, in some embodiments, the dimension 320a is 120 μm. As another example, in some embodiments, the dimension 320a is 145 μm.

The copper post 304a further includes a dimension 320b, which may be referred to as a bottom surface width (referring to the bottom surface 314b) of the copper post 304a. The dimension 320b extends along the X-axis (or Y-axis) from opposing regions of the bottom surface 314b of the copper post 304a, as shown in FIG. 3. The dimension 320b may be approximately in the range of 50 to 500 μm. For example, in some embodiments, the dimension 320b is 180 μm.

Based on the dimensional characteristics, several ratios of dimensions of the copper post 304a are present. For example, the copper post 304a may include a height-to-width ratio of 0.67, when the dimension 320a is 120 μm and the dimension 320b is 180 μm. The "height-to-width ratio" may refer to a dimensional comparison between the height (i.e., dimension 320a) of the copper post 304a to the bottom surface width (i.e., dimension 320b) of the copper post 304a. Alternatively, the copper post 304a may include a height-to-width ratio of 0.81, when the dimension 320a is 145 μm and the dimension 320b is 180 μm.

The copper post 304a further includes a dimension 320c, which may be referred to as a top surface width of the pad 312a. The dimension 320c extends from opposing regions of the top surface 314a of the pad 312a, as shown in FIG. 3. The dimension 320c may be approximately in the range of 150 to 190 μm. For example, in some embodiments, the dimension 320c is 170 μm.

The copper post 304a may include a taper ratio of 0.94, when the dimension 320c is 170 μm and the dimension 320b is 180 μm. The "taper ratio" may refer to a dimensional comparison between the top surface width (i.e., dimension 320c) of the copper post 304a to the bottom surface width (i.e., dimension 320b) of the copper post 304a.

The ratios may be achieved by forming the copper post 304a through a batch plating operation. Beneficially, the batch plating operation avoids forming/stacking a series of smaller copper layers on top of a prior layer, which can lead to swelling. As a result of the relatively high taper ratio (due in part to batch plating), the copper post 304a more closely resembles a rectangular cross section as opposed to a trapezoidal cross section. This may lead to additional dimensional advantages. For example, a dimension 320d represents an edge-to-edge separation between the copper posts 304a and 304b, and a dimension 320e represents a pitch, or center-to-center separation, between respective centers of the copper posts 304a and 304b. The dimensions 320d and 320e may be shorter as compared to using solder balls. Beneficially, additional posts, similar to the copper posts 304a and 304b, may be located on the surface 302b. The dimension 320d may be approximately in the range of 100 to 120 µm. For example, in some embodiments, the dimension 320d is 110 µm. Also, a dimension 320e represents a pitch, or center-to-center separation, between respective centers of the copper posts 304a and 304b. The dimension 320e may be approximately in the range of 270 to 310 µm. For example, in some embodiments, the dimension 320e is 290 µm.

The copper post 304a further includes a dimension 320f, which may be referred to as a width of the pad 312a. The dimension 320f extends from opposing regions of the pad 312a, as shown in FIG. 3. The dimension 320f may be approximately in the range of 200 to 220 µm. For example, in some embodiments, the dimension 320f is 210 µm.

It should be noted that any dimensional characteristics shown and described for the copper post 304a may also apply to the copper post 304b.

Figure 4:
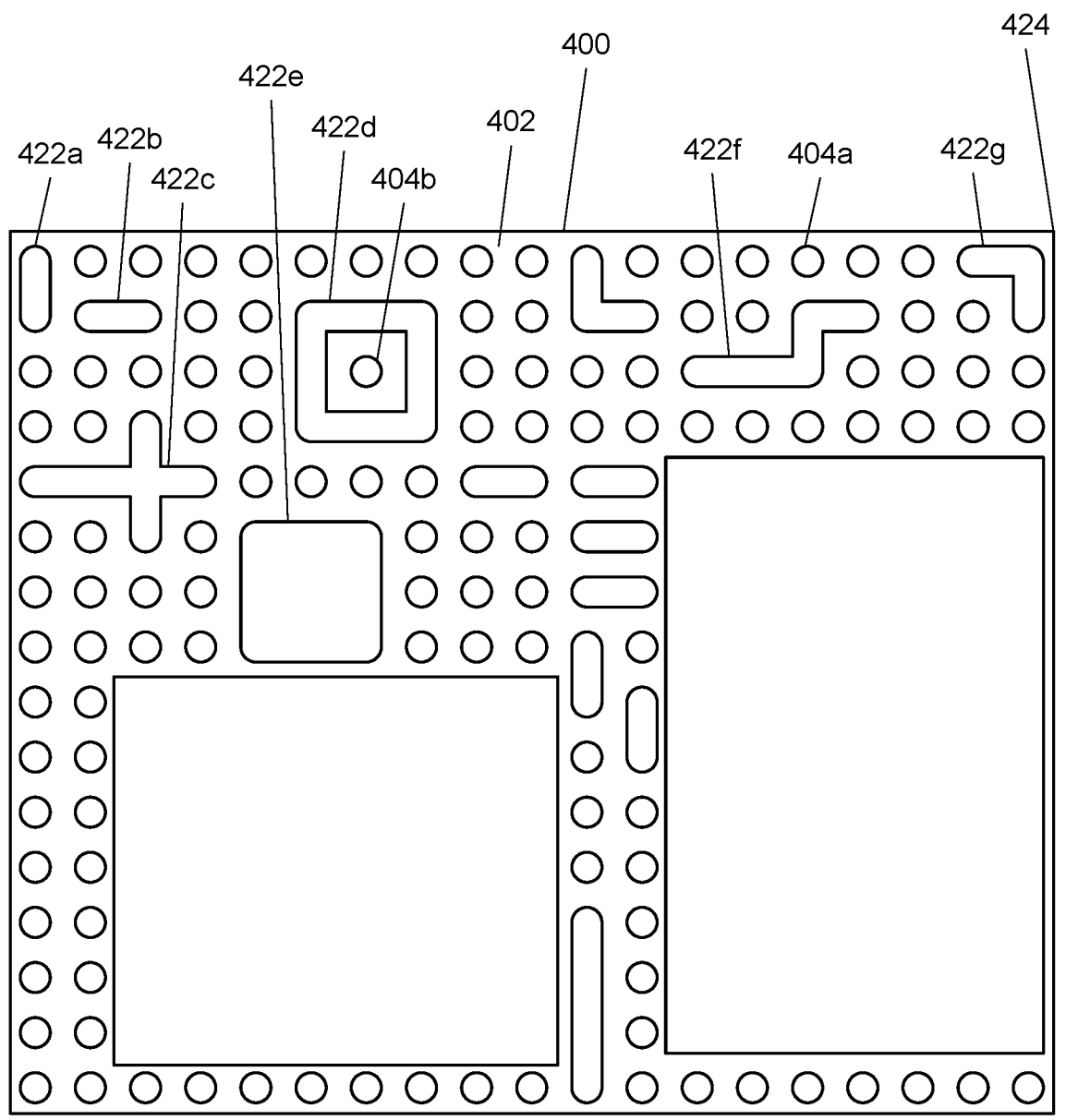
FIG. 4 illustrates a plan view of a substrate with copper structures of various shapes, in accordance with aspects of the present disclosure.

Referring to FIG. 4, a substrate 400 includes a surface 402 (e.g., bottom surface) on which several copper posts and several copper structures formed (from several merged copper posts) are located. For example, the substrate 400 includes a copper post 404a with dimensional characteristics similar to prior copper posts shown and described herein. The substrate 400 further includes a copper structure 422a and a copper structure 422b, each of which is formed from merging at least two copper posts together to form a bar located along a column and a row, respectively. Additionally, the s substrate 400 may include a copper structure 422c formed from merging at least two copper posts together to form two bars that intersect each other.

The substrate 400 further includes a copper structure 422d formed from merging multiple copper posts together to form a four-sided structure that surrounds a copper post 404b. The substrate 400 further includes a copper structure 422e formed from merging multiple copper posts together to form a four-sided, solid copper block.

The substrate 400 further includes a copper structure 422f formed from merging at least three copper posts together to form three different sections. Also, the substrate 400 further includes a copper structure 422g formed at, or along, a corner 424 of the substrate 400. The copper structure 422g may be formed from merging at least two copper posts together to form multiple bars located along a column and a row. As a result of the copper structure 422g being located along the corner 424, the substrate 400 is provided with structural support, based upon the copper structure 422g, at the corner 424. Beneficially, this may prevent cracking or breaking of the substrate 400, particularly at the corner 424.

It should be noted that generally any combination of the copper structures 422a, 422b, 422c, 422d, 422e, 422f, and 422g, may be present on the surface 402 of the substrate 400. Put another way, the layout of the copper structures 422a, 422b, 422c, 422d, 422e, 422f, and 422g on the surface 402 of the substrate 400 should not be construed as a limiting layout. Also, any of the copper structures 422a, 422b, 422c, 422d, 422e, 422f, and 422g may be present at the corner 424 and/or at another corner (not labeled) of the substrate 400. Further, the copper structures 422a, 422b, 422c, 422d, 422e, 422f, and 422g may perform I/O functions similar to that of copper posts shown and described herein, and may also include at least some dimensional characteristics, and resultant ratios, as shown and described herein for copper posts.

Referring to FIGS. 5A-5F, several types of copper structures are shown along with dimensional characteristics. In FIGS. 5A-5F, a dimension 520a may be approximately in the range of 50 to 500 µm, and a dimension 520b may be at least 100 µm. Also, each of the copper structures shown in FIGS. 5A-5F may include multiple merged copper posts. Also, the copper structures shown and described in FIG. 5A-5F may include similar height-to-width ratios and taper ratios as those shown and described in prior embodiments. Also, while the copper structures shown in FIGS. 5A-5F include rounded corners, each of the copper structures may alternatively include edges that form right angles (e.g., 90-degree angles).

Figure 5A:
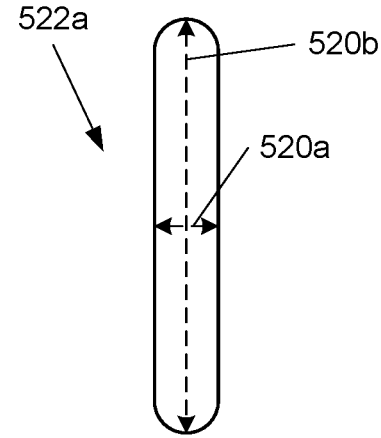
FIGS. 5A-5F illustrate various examples of copper structures, in accordance with aspects of the present disclosure.
Figure 5B:
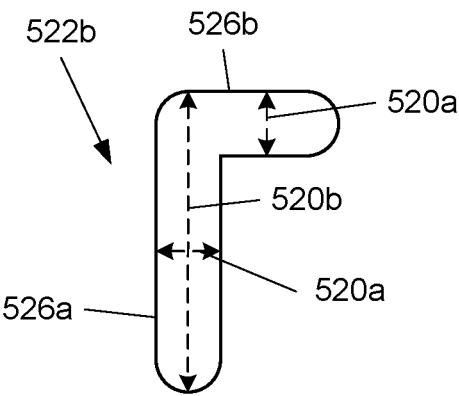
Figure 5C:
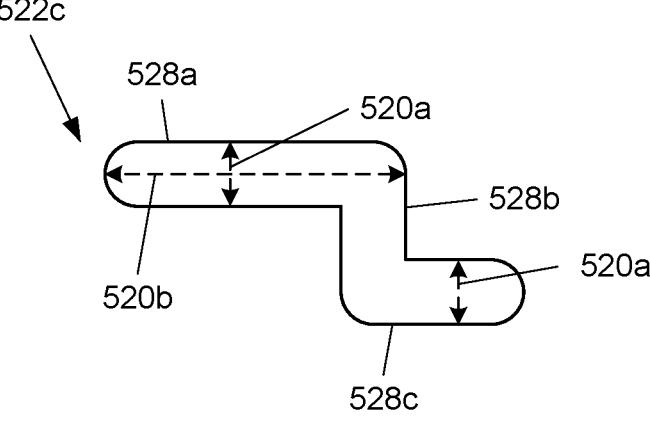
Figure 5D:
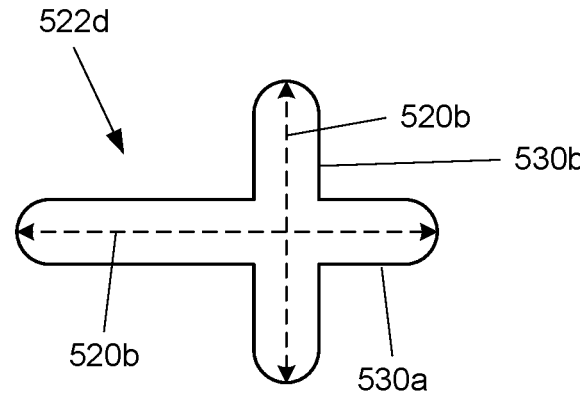
Figure 5E:
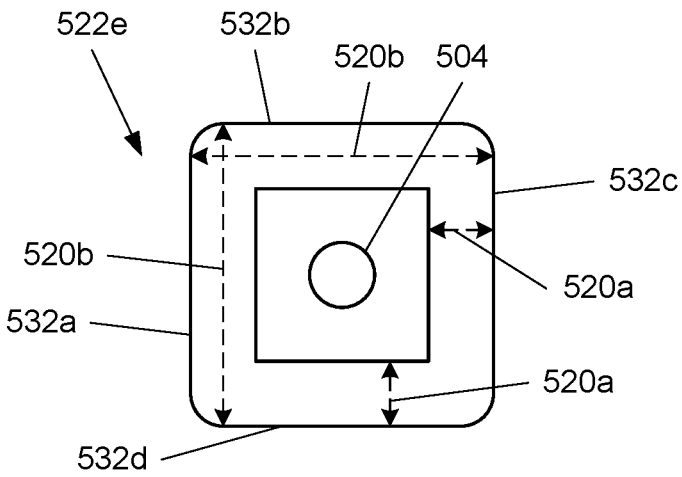
Figure 5F:
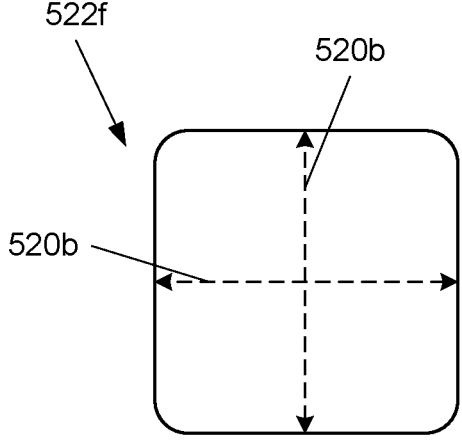

FIG. 5A shows a copper structure 522a that takes the form of a copper bar. As a non-limiting example, a "copper bar" may refer to a structure resulting in the combination of multiple copper posts. As shown in FIG. 5A, the copper structure 522a include rectangular features in which one dimension is greater than another dimension. FIG. 5B shows a copper structure 522b that takes the form of an L-shape in which two bars are merged together. As shown, a section 526a and a section 526b are merged together, with the sections 526a and 526b being perpendicular to each other. FIG. 5C shows a copper structure 522c that takes the form of a bent bar shape in which three bars are merged together. As shown, a section 528a, a section 528b, and a section 528c are merged together, with the sections 526a and 526c being perpendicular to the section 528b. FIG. 5D shows a copper structure 522d that takes the form of a cross in which two bars are merged together. As shown, a section 530a and a section 530b are merged together, with the sections 530a and 530b being perpendicular to each other. FIG. 5E shows a copper structure 522e that takes the form of a 4-sided structure (e.g., square or rectangle) in which four bars are merged together and surround a copper post 504. As shown, a section 532a, a section 532b, a section 532c, and a section 532d are merged together, with the sections 532a and 532c being perpendicular to the sections 532b and 532d. It should be noted that the copper post 504 may be removed. FIG. 5F shows a copper structure 522f that takes the form of a 4-sided block.

Figure 6:
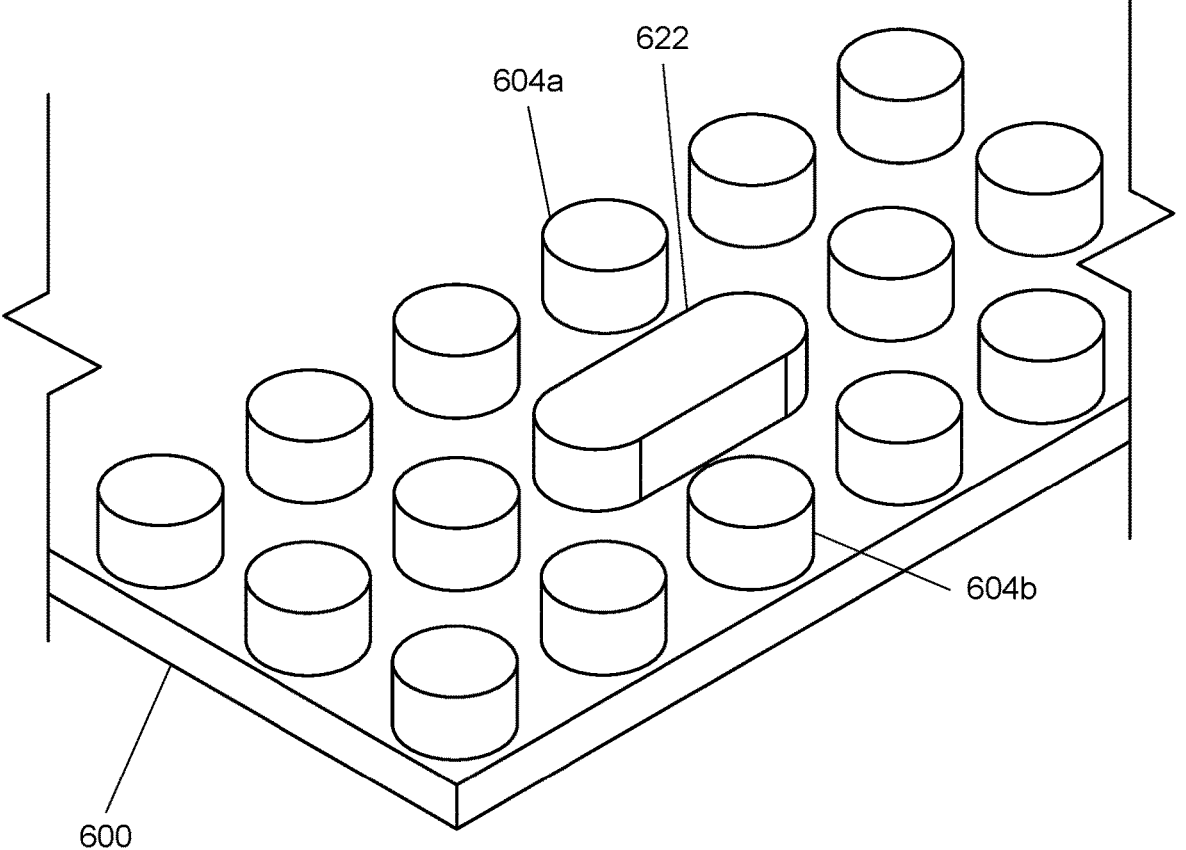
FIG. 6 illustrates a perspective view of a bar-type copper post separating two copper posts used as signal pins, in accordance with aspects of the present disclosure.

Referring to FIG. 6, a substrate 600 includes a copper post 604a and a copper post 604b. As shown, a copper structure 622 separates the copper posts 604a and 604b. The copper posts 604a and 604b may be used for communication, and accordingly, may each be referred to as a signal pin. For example, the copper post 604a and the copper post 604b may be used as an input and an output, respectively. The copper structure 622 may include an electrically grounded structure. Due in part to the electrical grounding of the copper structure 622, the copper structure 622 acts as a shield that may be used as an RF shield that creates an isolation wall between the copper posts 604a and 604b. In this regard, the copper structure 622 can provide RF isolation (or conversely, decreases RF interference) between the copper posts 604a and 604b. The copper structure 622 is exemplary and may be substituted for other copper structures, such as those shown in FIGS. 5A-5F.

Referring to FIG. 7, a substrate 700 includes a copper post 704, a die 706, and a material 734 located on a surface 702 of the substrate 700. The material 734 may include a plated material. A "plated material" may include at material that is applied or disposed onto a substrate through a plating operation that may include one or plates applied sequentially to the substrate. In this regard, the material 734 can be plated to a surface 702 of the substrate 700. In some embodiments, the material 734 includes nickel (Ni). In some embodiments, the material 734 includes gold (Au). In some embodiments, the material 734 includes a Ni—Au combination. As shown, the material 734 can be selectively applied to locations on the surface 702 other than the die 706. Also, although not shown in FIG. 7, the material 734 can be applied to a surface 705 of the copper post 704.

Referring to FIG. 8, a substrate 800 includes a copper post 804 and a material 836 located on the copper post 804. In some embodiments, the material 836 includes solder. Beneficially, the material 836 provides a physical connection by adding thermal energy to the material 836 to melt the material 836 and secure the copper post 804 to a circuit board (not shown in FIG. 8), as opposed to initially adding a material (e.g., solder) to the circuit board. Beneficially, the substrate 800 can be provided to end users with enhanced assembly features.

Referring to FIG. 9, a substrate 900 includes a copper post 904 and a material 938 located on the copper post 904. In some embodiments, the material 938 includes a coating, such as an organic solderability preservative. In this regard, the copper post 904 includes material (i.e., material 938) used to bond the copper post 904 with a component (e.g., I/O component) on a circuit board (not shown in FIG. 9).

Various examples of aspects of the disclosure are described below as clauses for convenience. These are provided as examples, and do not limit the subject technology.

One or more of the above clauses can include one or more of the features described below. It is noted that any of the following clauses may be combined in any combination with each other, and placed into a respective independent clause, e.g., clause A, B, or C.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to", "operable to", and "programmed to" do not imply any particular tangible or intangible modification of a subject, but, rather, are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

The word "exemplary" is used herein to mean "serving as an example, instance, or illustration". Any embodiment described herein as "exemplary" or as an "example" is not necessarily to be construed as preferred or advantageous over other embodiments. Furthermore, to the extent that the term "include", "have", or the like is used in the description or the claims, such term is intended to be inclusive in a manner similar to the term "comprise" as "comprise" is interpreted when employed as a transitional word in a claim.

When an element is referred to herein as being "connected to," "coupled to," or "disposed on" another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for".

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more". Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A substrate comprising:
a first surface;
a second surface opposite the first surface;
a first copper post disposed on the second surface, wherein the first copper post comprises a height-to-width ratio of at least 0.67; and
a second copper post, wherein the first copper post and the second copper post form a copper structure of a shape different from each of the first copper post and the second copper post, the copper structure comprising an electrically grounded structure located between the first copper post and the second copper post.

2. The substrate of claim 1, wherein the height-to-width ratio is at least 0.80.

3. The substrate of claim 1, wherein a pitch between the first copper post and the second copper post is less than 400 micrometers.

4. The substrate of claim 1, further comprising an integrated circuit disposed on the first surface and coupled to the first copper post.

5. The substrate of claim 1, wherein the first copper post comprises a taper ratio of at least 0.9.

6. The substrate of claim 1, further comprising a plated material disposed on the first copper post.

7. The substrate of claim 6, wherein the plated material comprises nickel and gold.

8. The substrate of claim 1, further comprises a solder disposed on the first copper post.

9. A substrate comprising: a first surface;

a second surface opposite the first surface;

a first copper post mounted to the second surface;

a second copper post mounted to the second surface; and a copper structure comprising an electrically grounded structure located between the first copper post and the second copper post, the copper structure forming a radio frequency shield that creates an isolation wall between the first copper post and the second copper post.

10. The substrate of claim 9, wherein the copper structure comprises a copper bar that is electrically grounded.

11. The substrate of claim 9, wherein the first copper post comprises a height-to-width ratio of at least 0.67.

12. The substrate of claim 9, further comprising a third copper post, wherein a pitch between the first copper post and the third copper post is less than 400 micrometers.

13. The substrate of claim 9, further comprising a material located on a surface of on one of the first copper post or the second copper post.

14. A substrate, comprising:

a first surface;

a second surface opposite the first surface; and a copper structure comprising a plurality of merged copper posts, wherein the plurality of merged copper posts form a shape different from each copper post of the plurality of merged copper posts, and the plurality of merged copper posts forms an electrical connection with an integrated circuit disposed on the first surface, and the copper structure comprises an electrically grounded structure located between a first copper post and a second copper post of the plurality of merged copper posts.

15. The substrate of claim 14, wherein:

a surface-mount substrate defines a corner, and the copper structure is located at the corner.

16. The substrate of claim 14, wherein the copper structure comprises a height-to-width ratio of at least 0.67.

17. The substrate of claim 14, wherein the copper structure comprises:

a first section; and a second section perpendicular with respect to the first section.

18. The substrate of claim 17, wherein the copper structure further comprises a third section perpendicular with respect to the second section.

19. The substrate of claim 14, wherein the copper structure comprises a copper ring.

* * * * *